United States Patent [19]

Okano et al.

[11] Patent Number: 5,164,874
[45] Date of Patent: Nov. 17, 1992

[54] APPARATUS FOR PROTECTING AGAINST OVERVOLTAGE

[75] Inventors: Nobuhiro Okano, Nara; Hiroshi Uemura, Kyoto, both of Japan

[73] Assignee: Sharp Kabushiki Kaisha, Osaka, Japan

[21] Appl. No.: 668,720

[22] Filed: Mar. 13, 1991

Related U.S. Application Data

[63] Continuation of Ser. No. 422,019, Oct. 16, 1989, abandoned.

[30] Foreign Application Priority Data

Oct. 20, 1988 [JP] Japan ................. 63-265630

[51] Int. Cl.$^5$ ............................................. H02H 9/04
[52] U.S. Cl. ........................................ 361/56; 361/91; 361/104
[58] Field of Search ............... 361/56, 91, 111, 104, 361/55; 357/23.13

[56] References Cited

U.S. PATENT DOCUMENTS 4,322,767  3/1982  El Hamamsy et al. ............. 361/56
4,520,419  5/1985  Locher et al. ..................... 361/56 X Primary Examiner—Todd E. Deboer

[57] ABSTRACT

An apparatus for protecting against overvoltage includes a semiconductor switching element and a trigger element. The semiconductor switching element is formed of a PNPN junction including a plurality of PN junctions and the trigger element has a characteristic similar to that of a PN junction Zener diode. The apparatus for protecting against overvoltage is normally nonconductive; however, once an overvoltage not lower than a defined level is applied, the trigger element attains a state so as to have a gate current flow from a gate electrode thereof to the semiconductor switching element. In response to this, the semiconductor switching element causes a so-called thyristor phenomenon, thereby protecting a load connected in parallel to the apparatus for protecting against overvoltage, i.e., an object to be protected, from being provided with the overvoltage.

8 Claims, 2 Drawing Sheets

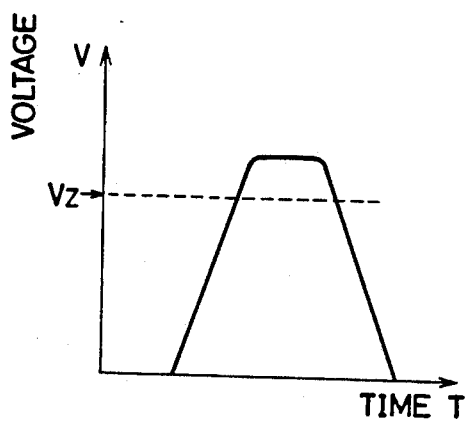
FIG.4A
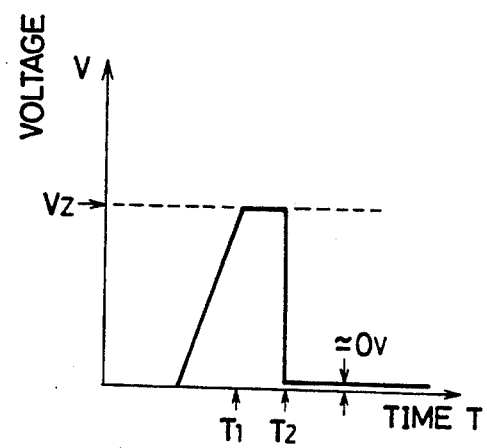
FIG.4B
FIG.5
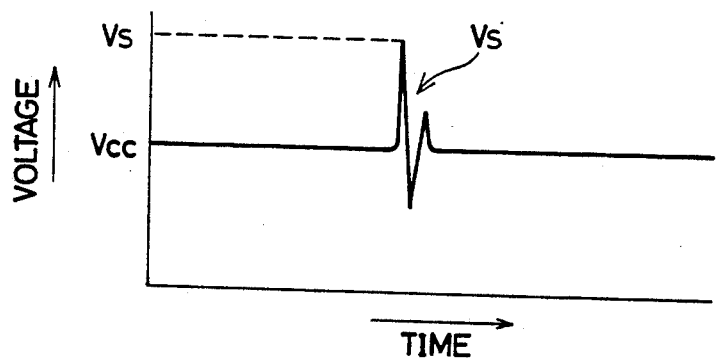
FIG.6 PRIOR ART
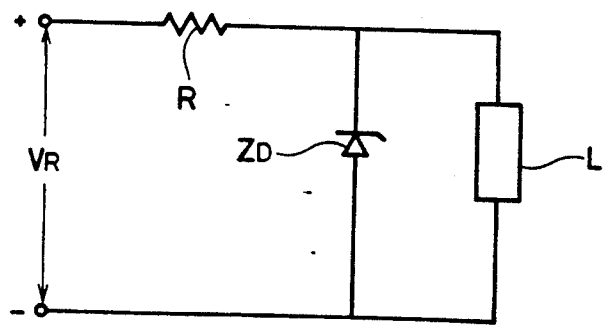

APPARATUS FOR PROTECTING AGAINST OVERVOLTAGE

This application is a continuation of application Ser. No. 07/422,019, filed on Oct. 16, 1989, now abandoned.

BACKGROUND OF THE INVENTION

1. Field of the Invention

The present invention relates generally to apparatuses for protecting against overvoltage and, more particularly, to apparatuses for protecting electrical apparatuses, circuits and the like driven by direct current power sources against detrimental overvoltage.

2. Description of the Background Art

A fuse is one representative of conventional apparatuses for protecting electrical apparatuses and circuits against overcurrents applied thereto. The fuse, which is connected in series to a load, is melted by Joule heat generated when an overcurrent higher than a rated current flows through a circuit, and thus is employed to cut energization applied from a power source. In order to achieve this purpose, the fuse has a rated current defined therein, so that the fuse is to be selected in accordance with its own purpose for practical use.

The fuse is less expensive with its simple structure, and thus has been widely used as a representative of safety devices for electrical apparatuses. However, since a fuse can not be reused once it has been melted, there has been a need for a spare fuse.

Meanwhile, other protective apparatuses are proposed such as a circuit breaker and a protector. These proposed apparatuses can be used repetitively if a cause of the overcurrent is removed; however, they are large-scaled with complicated structures due to the requirement of a switch disengaging mechanism which operates in response to the overcurrent, and thus are expensive and require a large space to be installed. Therefore, they cannot be employed as easily as the fuse.

Moreover, the circuit breaker and the fuse both employ energy caused by the overcurrent, and require much time and energy of a certain level or more to achieve their own purposes.

Meanwhile, as in the case of a computer, circuits of low operating voltage and small operating, i.e., decreased power requirements have been developed since the appearance of semiconductor elements. An electronic apparatus employing such a circuit should be protected against overvoltage rather than overcurrent. Therefore, it often occurs, for example, that an overvoltage $V_S$ which has a pulse waveform generally called a spike, which is instantaneously applied at the level exceeding the level of a rated voltage $V_{CC}$ of a load (e.g., 5V), as shown in FIG. 5, results in an abnormal operation of the load and destruction of the circuit. In such a case, energy generated instantaneously is relatively small, so that a power consumption type protective apparatus, such as the described fuse or the breaker, cannot cope with the applied overvoltage. A Zener diode and a varistor serve as apparatuses for protecting against overvoltage which cope with such a problem. However, in the case of employing the Zener diode or the varistor as the apparatus for protecting the electrical apparatus and circuit against overvoltage, the following disadvantages occur, and thus it is impossible to realize a sufficiently quick response to an applied overvoltage.

FIG. 6 shows one example of an electrical circuit diagram employing a Zener diode as the apparatus for protecting against overvoltage.

As shown in this figure, $V_R$ is a variable voltage, R is a resistor, $Z_D$ is a Zener diode, and L is a load connected in parallel to the Zener diode $Z_D$. The Zener diode $Z_D$, which is also called a constant voltage diode, has its both ends supplied with a constant voltage so as to protect the load L against a surge. However, when a voltage equal to or higher than a Zener voltage is applied to the load L by a surge current due to an overvoltage applied by the voltage $V_R$ (for example, an overvoltage $V_S$ shown in FIG. 5), the load L is caused to malfunction.

Furthermore, there is another problem that due to a current flowing in the state that the overvoltage is applied, the Zener diode $Z_D$ has its own heat value increased and thus burns out. In addition, there also arises a problem that since the overvoltage is kept applied to the load L connected in the period that the overvoltage is applied, an apparatus corresponding to the load L causes malfunction and thus a burnout.

Further, in the case that the varistor is substituted for the Zener diode $Z_D$ shown in FIG. 6, the same disadvantage as in the Zener diode is caused with respect to the applied overvoltage. Moreover, in the case of employing the varistor as the apparatus for protecting against overvoltage, it is impossible to form the varistor with other circuit elements as a semiconductor integrated circuit. In detail, a manufacturing method of the varistor is complicated because various kinds of oxides are sintered in a reduction atmosphere in the manufacturing process, so that it is impossible to integrate the varistor on the semiconductor integrated circuit.

Therefore, implementation of a small and inexpensive apparatus for protecting against overvoltage has been desirable, which can also be used as easily as a fuse, Zener diode, the varistor or the like, and has a sufficiently quick response even to an overvoltage applied in such a short period as described above.

SUMMARY OF THE INVENTION

It is an object of the present invention to provide an apparatus for protecting against overvoltage, having a sufficiently quick response to an overvoltage applied in an extremely short period.

It is another object of the present invention to provide an apparatus for protecting against overvoltage, which can be used as easily as a fuse, Zener diode, a varistor or the like.

It is a further object of the present invention to provide a small-scaled apparatus for protecting against overvoltage, which can be manufactured at a low cost.

The apparatus for protecting against overvoltage according to the present invention, comprising a semiconductor switching element formed of a plurality of stages of PN junctions, and a semiconductor element for controlling conduction of the semiconductor switching element at a predetermined voltage level, detects the level of a supply voltage exceeding the predetermined level by the semiconductor element connected to one electrode of a power source line, and instantaneously renders the semiconductor switching element connected to the semiconductor element conductive. This conduction causes a short-circuit between both electrodes of the power source line, and thus this short-circuit protects a load from being provided with an overvoltage not lower than the predetermined level.

Since the apparatus for protecting against overvoltage according to the present invention is manufactured through the same process as the other semiconductor elements, the apparatus is extremely small-scaled, also acceptable in a container for a conventional fuse contained in a glass tube, and can easily be connected to the power source line of an electrical apparatus.

The apparatus for protecting against overvoltage according to the present invention is normally in a non-conducting state and is rendered conductive by application of the overvoltage; however, since the apparatus recovers from the conducting state to the non-conducting state due to the fact that the voltage applied to the apparatus is thereafter interrupted, the apparatus can easily be used repetitively.

As described above, the present invention is provided for implementing by a simple means the apparatus for protecting against overvoltage, having a quick response even to an overvoltage applied in a short period through the power source line.

The foregoing and other objects, features, aspects and advantages of the present invention will become more apparent from the following detailed description of the present invention. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 4A is a graph for illustrating a voltage level to be applied to a load in the case that an overvoltage is applied to an electrical circuit shown in FIG. 6;

FIG. 4B is a graph for illustrating a voltage level to be applied to the load in the case that an overvoltage is applied to the electrical circuit shown in FIG. 3;

FIG. 5 is a waveform diagram illustrating the state of an overvoltage; and

FIG. 6 is an electrical circuit diagram employing a Zener diode as the apparatus for protecting against overvoltage.

DESCRIPTION OF THE PREFERRED EMBODIMENTS

The embodiment of the present invention will now be described in detail with reference to the figures.

Figure 1:
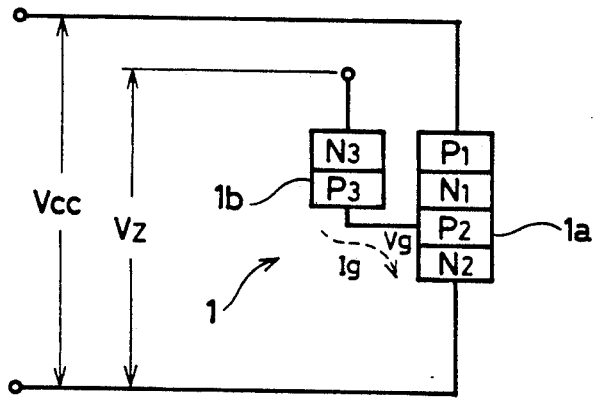
FIG. 1 is a block diagram illustrating the configuration of an apparatus for protecting against overvoltage according to one embodiment of the present invention.

FIG. 1 is a schematic block diagram illustrating the configuration of an apparatus for protecting against overvoltage according to one embodiment of the present invention. The apparatus 1 for protecting against overvoltage in FIG. 1 comprises a semiconductor switching element 1a and a trigger element 1b. The semiconductor switching element 1a is formed of PNPN junction including a plurality of PN junctions and comprises a first electrode P1, a second electrode N1, a third electrode P2 and a fourth electrode N2. The trigger element 1b has a characteristic similar to a PN junction Zener diode and comprises a cathode N3 and an anode P3. The semiconductor switching element 1a and the trigger element 1b have the respective third electrode P2 and anode P3 connected to each other to be integrally formed as an integrated circuit.

The semiconductor switching element 1a causes a so-called thyristor phenomenon; that is, a forward bias voltage is first applied to the semiconductor switching element 1a, namely, a voltage $V_{cc}$ is applied from the first electrode P1 as a positive polarity to the fourth electrode N2 as a negative polarity. Further, a bias voltage $V_g$ is applied forwardly from the third electrode P2 as the positive polarity to the fourth electrode N2 as the negative polarity. A gate current $I_g$ then flows in the direction of the fourth electrode N2 with the third electrode P2 used as a gate electrode. As a result, a portion between the first electrode P1 and the fourth electrode N2 becomes conductive (turn-on).

The trigger element 1b has a characteristic similar to that of a PN junction Zener diode. When a Zener voltage $V_z$, which is a predetermined voltage level, is reversely applied to the trigger element 1b, a portion between the cathode N3 and the anode P3 break down, and the gate current $I_g$ flows from the cathode N3 through the anode P3 so as to make the third electrode P2 of the semiconductor switching element 1a of positive polarity. Accordingly, the portion between the first electrode P1 and the fourth electrode N2 of the semiconductor switching element 1a experiences the thyristor phenomenon and becomes conductive, as described above. This conduction is normally achieved in an extreme instant of several nS (nanoseconds) after generation of the Zener voltage $V_z$. Therefore, even if the voltage $V_s$, which is an instant pulse waveform as shown in FIG. 5, is applied to the apparatus 1 for protecting against overvoltage, the semiconductor switching element 1a quickly becomes conductive in response to the applied voltage $V_s$, and is kept conductive while the voltage $V_{cc}$ is applied thereto.

An integral structure of the semiconductor switching element 1a and the trigger element 1b is implemented by being integrated on a substrate such as of a silicon wafer by such manufacturing methods as alloying, diffusion, an epitaxial process or the like. The Zener voltage $V_z$ of the trigger element 1b is set to be a desired value through the process of the integration of the integral structure.

Figure 2:
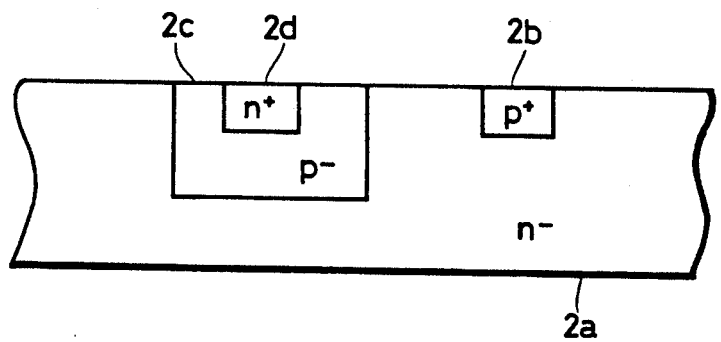
FIG. 2 is a schematic diagram illustrating a sectional structure of an integrated circuit of the apparatus for protecting against overvoltage according to one embodiment of the present invention.

A description will be given on the integral structure formed of integration of the semiconductor switching element 1a and the trigger element 1b, with reference to FIG. 2. FIG. 2 is a schematic diagram illustrating a sectional structure of an integrated circuit of the apparatus for protecting against overvoltage according to one embodiment of the present invention.

As shown in this figure, the integrated circuit of the apparatus for protecting against overvoltage comprises an $n^-$ type substrate 2a, a $p^+$ type impurity layer 2b, a $p^-$ type impurity layer 2c and an $n^+$ type impurity layer 2d.

A description will be given in regard to the correspondence of the respective electrodes of the semiconductor switching element 1a and of the trigger element 1b to the respective impurity layers shown in FIG. 2.

The cathode N3 corresponds to the n+ type impurity layer 2d, the anode P3 and the third electrode P2 correspond to the p− type impurity layer 2c, the first electrode P1 corresponds to the p+ type impurity layer 2b, the second electrode N1 corresponds to the n− type substrate 2a in contact with the p+ type impurity layer 2b and to the p− type impurity layer 2c, and the fourth electrode N2 corresponds to the n− type substrate 2a in contact with the p− type impurity layer 2c. The Zener voltage $V_z$ of the trigger element 1b is controlled by the impurity concentration of the PN junction with the lower concentration, i.e., the impurity concentration of the p− type impurity layer 2c.

As mentioned above, the apparatus 1 for protecting against overvoltage according to the present invention is manufactured through the same process as the other semiconductor elements, so that it becomes extremely small-scaled. In addition, since only two external connection terminals are connected to the apparatus as will be described later, the apparatus is also acceptable in a container for a conventional fuse contained in a glass tube and can be easily connected to a power source line of an electrical apparatus.

Figure 3:
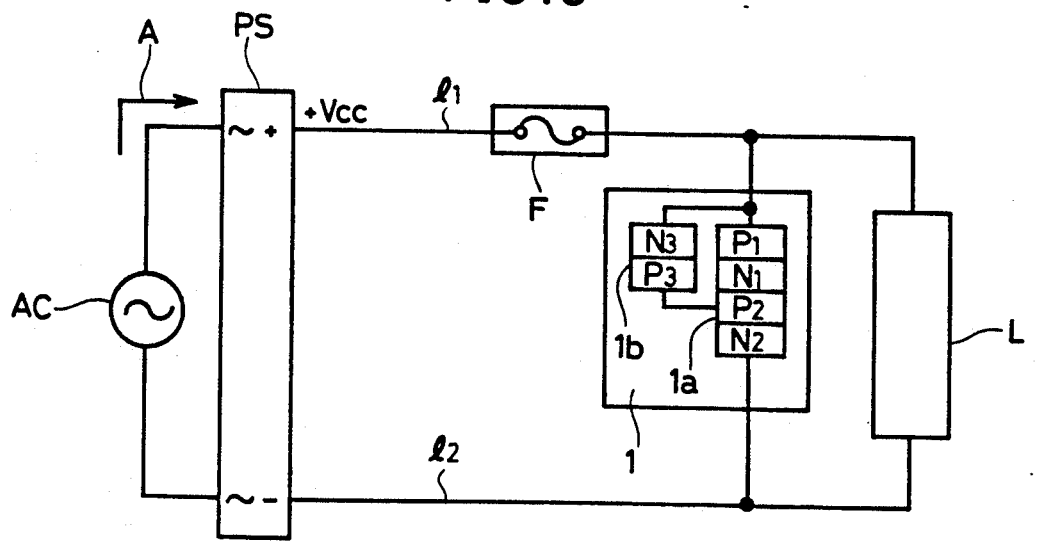
FIG. 3 is an electrical circuit diagram illustrating the apparatus for protecting against overvoltage of FIG. 1 in use.

FIG. 3 is an electric circuit diagram illustrating the apparatus for protecting against overvoltage in use according to one embodiment of the present invention. As shown in FIG. 3, the electric circuit comprises the apparatus 1 for protecting against overvoltage, a commercial power source AC, a power source portion PS, a load L, a fuse F, and power source lines 11 and 12. The above devices are interconnected via the power source lines 11 and 12. The apparatus 1 for protecting against overvoltage is connected in parallel to the load L, and the fuse F is connected in series to the described parallel circuit. Further, an alternating voltage supplied from the commercial power source AC to the circuit is applied to the power source portion PS to be converted into a direct current voltage, and a rated voltage $V_{cc}$ (e.g. 5V) of the load L is then provided with the power source line 11 used as the positive polarity and the other power source line 12 as the negative polarity. The rated voltage $V_{cc}$ derived from the power source portion PS is applied to a series circuit formed of the load L and the fuse F serving as means for preventing an overcurrent, so that the load L is supplied with power. The load L is, for example, a load circuit formed such as of a CPU (a central processing unit) and a memory.

Referring to this figure, the protective apparatus 1 has the first electrode P1 of the semiconductor switching element 1a and the cathode electrode N3 of the trigger element 1b connected in common to the power source line 11, and the fourth electrode N2 of the switching element 1a connected to the other power source line 12. Accordingly, the semiconductor switching element 1a is forward-biased between the power source lines 11 and 12, while the trigger element 1b is reverse-biased.

The Zener voltage $V_z$ of the trigger element 1b in the apparatus 1 for protecting against overvoltage is set to be $V_z > V_{cc}$, and it is assumed that, for example, the value $V_z = 6V$. Furthermore, the switching element 1a is nonconductive in the normal state, and it is assumed that the load L is provided with the rated voltage $V_{cc}$ via the fuse F.

When an overvoltage $V_s$, as shown in FIG. 5, exceeding the rated voltage $V_{cc}$ is applied in the direction of the arrow A between the power source lines 11 and 12, and thus the relationship between the overvoltage $V_s$ and the Zener voltage $V_z$ become $V_s > V_z$, the trigger element 1b instantaneously breaks down and the gate current $I_g$ flows in the third electrode P2, or the gate electrode of the semiconductor switching element 1a, so that the switching element 1a becomes conductive. Thus, the both ends of the load L are short-circuited via the apparatus 1 for protecting against overvoltage, and at the same time, a short-circuit current $I_s$ flows in the apparatus 1 through the fuse F. The fuse F is melted by the short-circuit current $I_s$ to prevent application of the supply voltage $V_{cc}$. Accordingly, the load L is prevented from being provided with the overvoltage $V_s$, so that the load L is protected against the overvoltage $V_s$. After the fuse F is melted, a lowering of the supply voltage $V_{cc}$ causes the apparatus 1 for protecting against overvoltage to recover from the conducting state to the non-conducting state.

Since the fuse F is melted within an instantaneous allowable time period even if the apparatus 1 becomes conductive to have the short-circuit current $I_s$ flow therethrough, the apparatus 1 for protecting against overvoltage is not destroyed due to the short-circuit current $I_s$, but is available for repetitive use.

The operation of the apparatus 1 for protecting against overvoltage, having the load L protected against overvoltage will be described in further detail with reference to FIGS. 4A and 4B.

FIG. 4A is a graph for illustrating a voltage level to be applied to the load in the case that the overvoltage is applied to the electric circuit shown in FIG. 6.

FIG. 4B is a graph for illustrating a voltage level to be applied to the load in the case that the overvoltage is applied to the electric circuit shown in FIG. 3.

In either of FIGS. 4A or 4B, the ordinate shows the voltage level V to be applied to the load, while the abscissa shows the time T.

Conventionally, in the case of employing a Zener diode $Z_d$ as the apparatus for protecting the load L against overvoltage, as shown in FIG. 6, when an overvoltage not lower than the Zener voltage $V_z$, as shown in FIG. 4A is applied from a variable voltage $V_R$, there flows a surge current due to this overvoltage. Therefore, the connected load L is provided with the overvoltage not lower than the Zener voltage $V_z$, so that the load L cannot be protected against the overvoltage.

Meanwhile, in the electric circuit shown in FIG. 3 according to the present invention, when the voltage not lower than the Zener voltage $V_z$ as shown in FIG. 4A is applied, the apparatus 1 for protecting against overvoltage causes a voltage to be applied to the load L to attain the voltage level shown in FIG. 4B, so that the load L is protected against the application of the overvoltage. In detail, the voltage level to be applied to the circuit becomes instantaneously high, and the Zener voltage $V_z$ is applied to the trigger element 1b at the time T1, so that the gate current $I_g$ starts flowing from the trigger element 1b to the semiconductor switching element 1a. In response to this, the semiconductor switching element 1a changes from the OFF state to the ON state. A voltage developing across the anode and cathode of the semiconductor switching element 1a attains the value $\approx 0V$ at the time T2 after an extremely short time period required for this change, i.e., a turn-on time. That is, when the overvoltage is applied, the voltage to be applied to the load L attains the value $\approx 0V$, so that the apparatus 1 for protecting against overvoltage is able to protect the load L against being applied by the overvoltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for protecting against overvoltage, connected in parallel to a load connected to a power source line, for protecting the load from being supplied with an overvoltage from a power source, comprising:

semiconductor switching means, for selectively shunting the load, configured of a first P region directly coupled to a positive polarity of the power source line, a first N region junctioned to said first P region, a second P region junctioned to said first N region, and a second N region junctioned to said second P region and directly coupled to a negative polarity of the power source line; and semiconductor trigger means, for switching said semiconductor switching means conductive, configured of a third N region directly coupled to the positive polarity of the power source line, and a third P region junctioned to said third N region and connected to said second P region of said semiconductor switching means, said semiconductor trigger means switching said semiconductor switching means conductive the instant a voltage applied from the power source line reaches an overvoltage level to shunt the load.

2. The apparatus for protecting against overvoltage according to claim 1, said semiconductor switching means and said semiconductor trigger means are formed as an integrated circuit.

3. An apparatus, connected in parallel to a load along a power source line, for protecting the load from an applied overvoltage from a power source, comprising:

semiconductor switching means, for selectively shunting the load, configured of a first P region directly coupled to a positive polarity of the power source line, a first N region junctioned to said first P region, a second P region junctioned to said first N region and a second N region junctioned to said second P region and directly coupled to a negative polarity of the power source line; and semiconductor trigger means, configured of a third N region directly coupled to said positive polarity of the power source line and junctioned to said second P region of said semiconductor switching means, for triggering conduction of said semiconductor switching means to shunt the load in response to an applied overvoltage from the power source in excess of a predetermined overvoltage level.

4. The apparatus for protecting a load according to claim 3, said semiconductor switching means and said semiconductor trigger means are formed as an integrated circuit.

5. An apparatus for protecting a load, connected via a power source line to a power source, from being provided with an overvoltage, comprising:

semiconductor means connected in parallel to the load for protecting against overvoltage; and fuse means connected in series to the load and to said semiconductor means for protecting against overcurrent, said semiconductor means for protecting against overvoltage comprising semiconductor switching means, for selectively shunting the load, configured of a first P region directly coupled to a positive polarity of the power source line, a first N region junctioned to said first P region, a second P region junctioned to said first N region and a second N region junctioned to said second P region and directly coupled to a negative polarity of the power source line, and semiconductor trigger means configured of a third N region directly coupled to said positive polarity of the power source line and junctioned to said second P region of said semiconductor switching means, for triggering conduction of said semiconductor switching means to shunt the load in response to an overvoltage of a predetermined voltage level.

6. The apparatus for protecting a load according to claim 5, said semiconductor switching means and said semiconductor trigger means are formed as an integrated circuit.

7. An overvoltage protection apparatus for protecting a load comprising:

semiconductor switching means, for selectively shunting the load, configured of a first P region directly coupled to a positive polarity of a power source, a first N region junctioned to said first P region, a second P region junctioned to said first N region and a second N region junctioned to said second P region and directly coupled to a negative polarity of said power source; and semiconductor trigger means, for switching said semiconductor switching means conductive, configured of a third N region directly coupled to said positive polarity of said power source and a third P region junctioned to said third N region and directly coupled to said second P region of said semiconductor switching means, said semiconductor trigger switching said semiconductor switching means upon application of an overvoltage from said power supply to short said positive and negative polarities of said power supply through said semiconductor switching means to shunt the load.

8. The overvoltage protection apparatus of claim 7, said semiconductor switching means and said semiconductor trigger means are formed together as an integrated circuit.

* * * * *